United States Patent
Tsai et al.

(10) Patent No.: US 7,781,279 B2
(45) Date of Patent: Aug. 24, 2010

(54) METHOD FOR MANUFACTURING A MEMORY

(75) Inventors: Hung-Mine Tsai, Kaohsiung (TW); Ching-Nan Hsiao, Kaohsiung County (TW); Chung-Lin Huang, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 308 days.

(21) Appl. No.: 12/018,209

(22) Filed: Jan. 23, 2008

(65) Prior Publication Data

US 2009/0087975 A1    Apr. 2, 2009

(30) Foreign Application Priority Data

Oct. 2, 2007    (TW) ............................... 96136925 A

(51) Int. Cl.
*H01L 21/8238*    (2006.01)

(52) U.S. Cl. ................. 438/201; 438/221; 438/593; 257/E21.422

(58) Field of Classification Search ............... 438/201, 438/211, 257, 593; 257/E21.179, E21.422
See application file for complete search history.

(56) References Cited

U.S. PATENT DOCUMENTS

2007/0004137 A1*   1/2007   Oh et al. ................. 438/257

\* cited by examiner

*Primary Examiner*—Thanhha Pham
(74) *Attorney, Agent, or Firm*—Winston Hsu

(57) ABSTRACT

A method for manufacturing a memory includes first providing a substrate with a horizontally adjacent control gate region and floating gate region which includes a sacrificial layer and sacrificial sidewalls, removing the sacrificial layer and sacrificial sidewalls to expose the substrate, forming dielectric sidewalls adjacent to the control gate region, forming a floating gate dielectric layer on the exposed substrate and forming a floating gate layer adjacent to the dielectric sidewalls and on the floating gate dielectric layer.

7 Claims, 17 Drawing Sheets

METHOD FOR MANUFACTURING A MEMORY

BACKGROUND OF THE INVENTION

1. Field of the Invention

The present invention relates to a method for manufacturing a memory. More particularly, the present invention relates to a method for manufacturing a memory with uniform thickness of the floating gate dielectric layer.

2. Description of the Prior Art

Flash memory is widely used because of its capability of non-volatile information storage. Generally speaking, flash memory is divided into two groups, NOR flash memory and NAND flash memory.

In NAND flash memory, the thickness of the floating gate dielectric layer plays an important role. FIG. 1 illustrates a conventional memory cell of NAND flash memory. The memory cell 100 includes a substrate 110, a floating gate 120, a floating gate dielectric layer 121, a control gate 130 and a control gate dielectric layer 131. The floating gate dielectric layer 121 is disposed between the substrate 110 and the floating gate 120, and the dielectric sidewall 140 is disposed between the floating gate 120 and the control gate 130.

In the conventional production of NAND flash memory, usually first the floating gate dielectric layer 121 then the control gate dielectric layer 131 is formed. When the floating gate dielectric layer 121 is formed, the thickness of the floating gate dielectric layer 121 can be well controlled. In other words, the thickness around the center of the floating gate dielectric layer 121 (a) and the thickness around both sides (b) are about the same.

However, after the control gate dielectric layer 131 is formed, the thickness of b would be increased due to the bird's beak of the control gate dielectric layer 131. The b point would have the best writing effect because of the strongest electric field, but now the total performance of the flash memory is drastically diminished due to the worse writing effect caused by the bird's beak.

Accordingly, a novel method for manufacturing a memory is needed to control the evenness of the thickness of the floating gate dielectric layer.

SUMMARY OF THE INVENTION

The present invention therefore provides a novel method for manufacturing a memory that first the control gate dielectric layer then the floating gate dielectric layer is formed, so the problem that the total performance of flash memory is drastically diminished due to the worse writing effect caused by the bird's beak may be completely avoided to ensure an efficient and stable writing effect.

One aspect of the present invention provides a method for manufacturing a memory, including first a substrate with a horizontally adjacent control gate region and floating gate region which includes a sacrificial layer and sacrificial sidewalls is provided. Then the sacrificial layer and sacrificial sidewalls are removed to expose the substrate. Afterwards, dielectric sidewalls adjacent to the control gate region, a floating gate dielectric layer on the exposed substrate and a floating gate layer adjacent to the dielectric sidewalls and on the floating gate dielectric layer is formed.

Another aspect of the present invention provides a method for manufacturing a memory. The method first includes providing a substrate with a first sacrificial layer and a second sacrificial layer formed thereon. Then the substrate, the first sacrificial layer and the second sacrificial layer are selectively removed to form a first trench exposing the substrate. Afterwards, the first trench is filled with a first dielectric material to form a shallow trench isolation and a second dielectric material is conformally disposed. Then the second dielectric material, the second sacrificial layer, the first sacrificial layer and the shallow trench isolation are selectively removed to expose the substrate, wherein the first trench is normal to the second trench. Afterwards, a control gate region including a control gate dielectric, a control gate and a hard mask in the second trench is formed. Then the second dielectric material and the second sacrificial layer are removed to form a third trench exposing the first sacrificial layer. Afterwards, a dielectric sidewall adjacent to the control gate region in the third trench is formed and the first sacrificial layer is selectively removed to expose the substrate. After a floating gate dielectric layer is formed on the exposed substrate, a floating gate layer is formed on the floating gate dielectric layer so that the floating gate layer is adjacent to the dielectric sidewall.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a novel method for manufacturing a memory. Because the control gate dielectric layer is formed before the formation of the floating gate dielectric layer, the problem that the thickness variation of the floating gate dielectric layer may be completely avoided to ensure an efficient and stable writing effect of flash memory.

Figure 1:
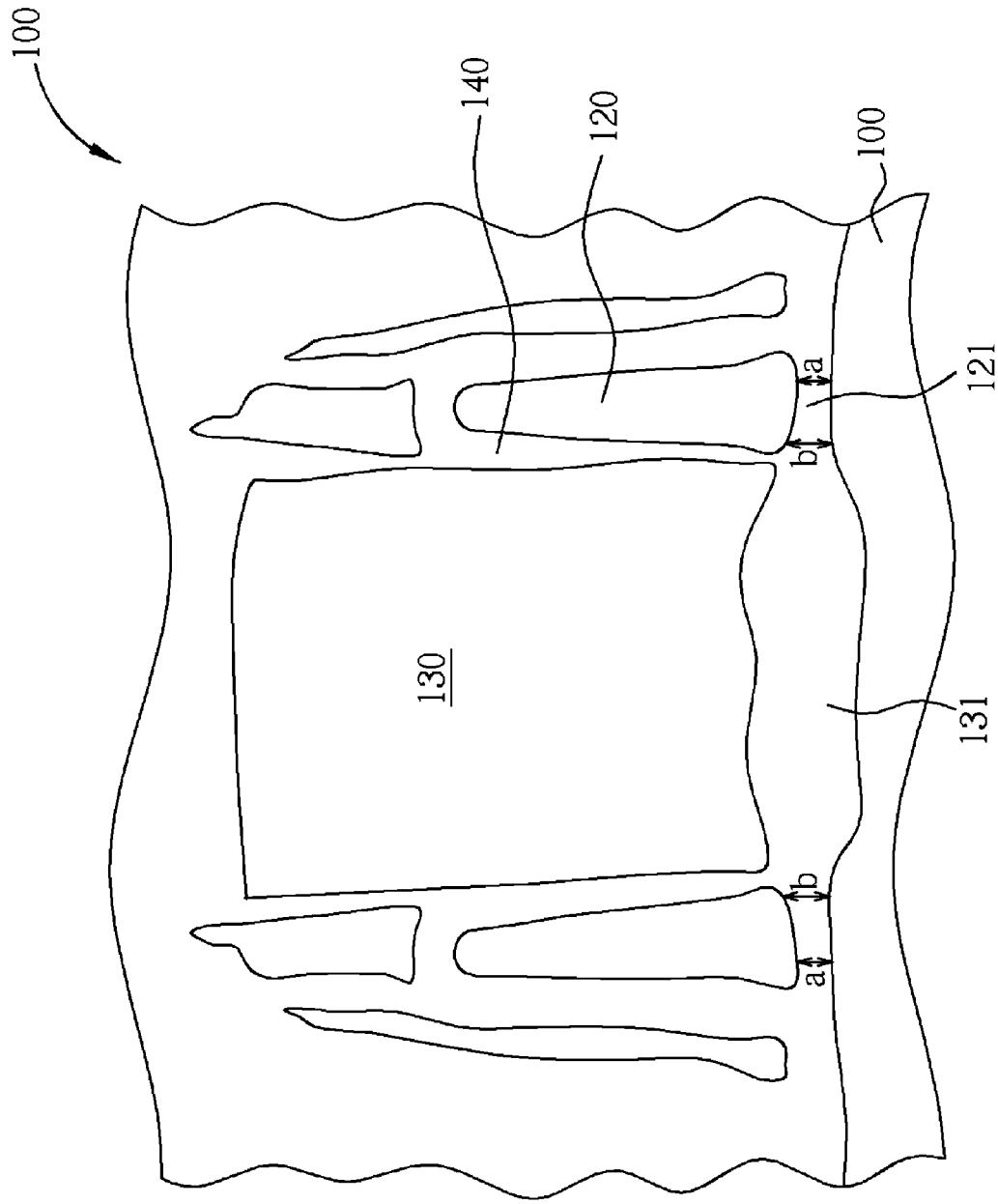
FIG. 1 illustrates a conventional memory cell of NAND flash memory.
Figure 2:
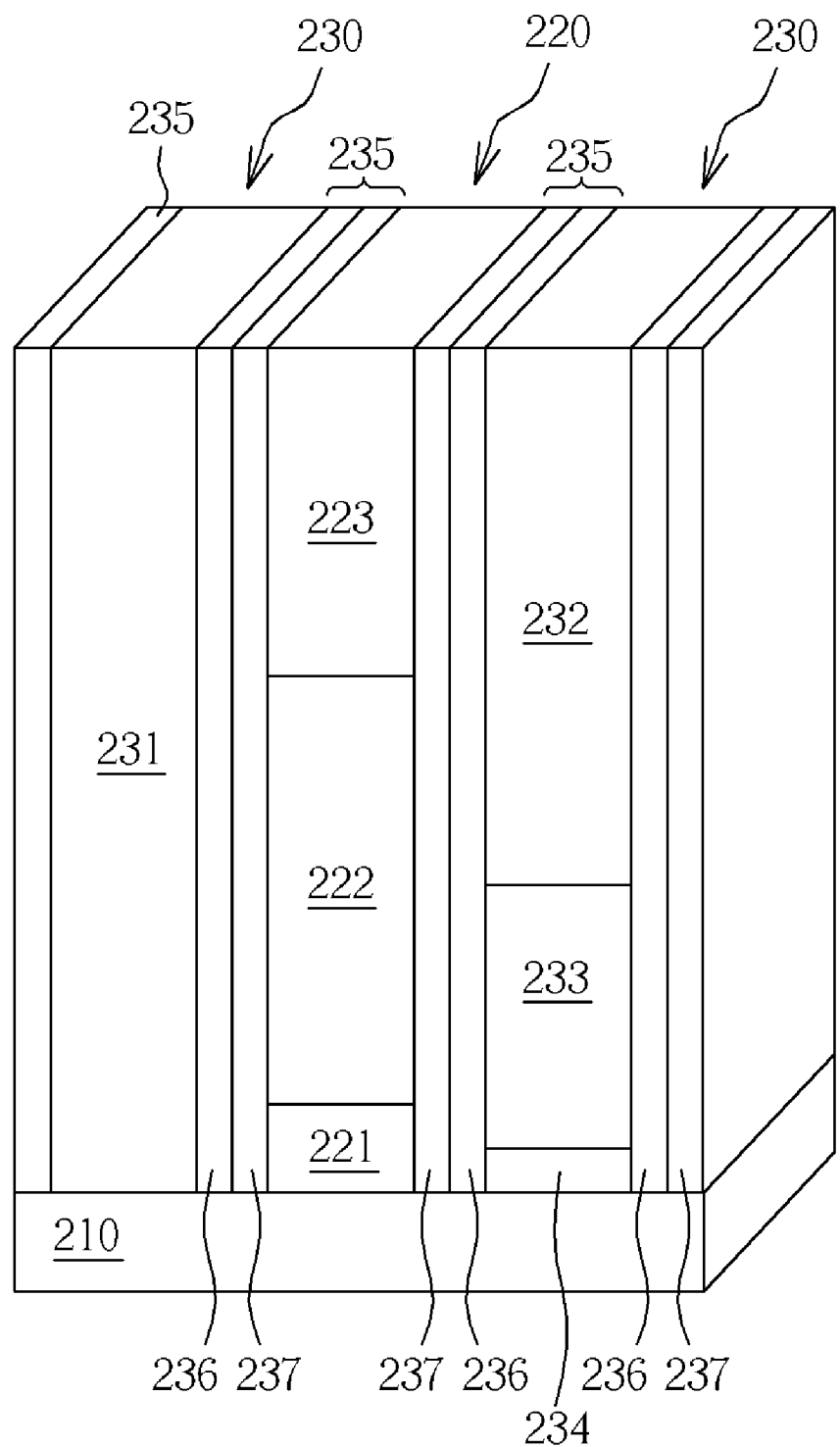
FIGS. 2-6 illustrate a preferred embodiment of the method of the present invention.

FIGS. 2-6 illustrate a preferred embodiment of the method of the present invention. First, as shown in FIG. 2, a substrate 210 with a horizontally adjacent control gate region 220 and floating gate region 230 is provided. The control gate dielectric layer 221 in the control gate region 220 contacts the substrate 210. The floating gate region 230 includes a sacrificial layer 231. In addition, the sacrificial sidewall layer 235 is disposed between the control gate region 220 and the floating gate region 230. The methods for forming the control gate region 220, the floating gate region 230 and the sacrificial sidewall layer 235 on the substrate 210 are conventionally known and the details will not be described here for brevity.

The substrate 210 may be made of a semiconductor material, such as silicon. On the other hand, the control gate region 220 may include the control gate oxide layer 221, a control gate 222 and a hard mask layer 223 as an etching stop layer, so that the control gate 222 is disposed between the control gate oxide layer 221 and the hard mask layer 223. For example, the control gate 222 may include polysilicon, and the hard mask layer 223 may be a composite structure, preferably an oxide-polysilicon-oxide composite structure. Similarly, the sacrificial sidewall layer 235 between the control gate region 220 and the floating gate region 230 may be a composite structure, an oxide 236-nitride 237 composite structure for example. In this way, each layer may be selectively removed in the following steps.

Figure 3:
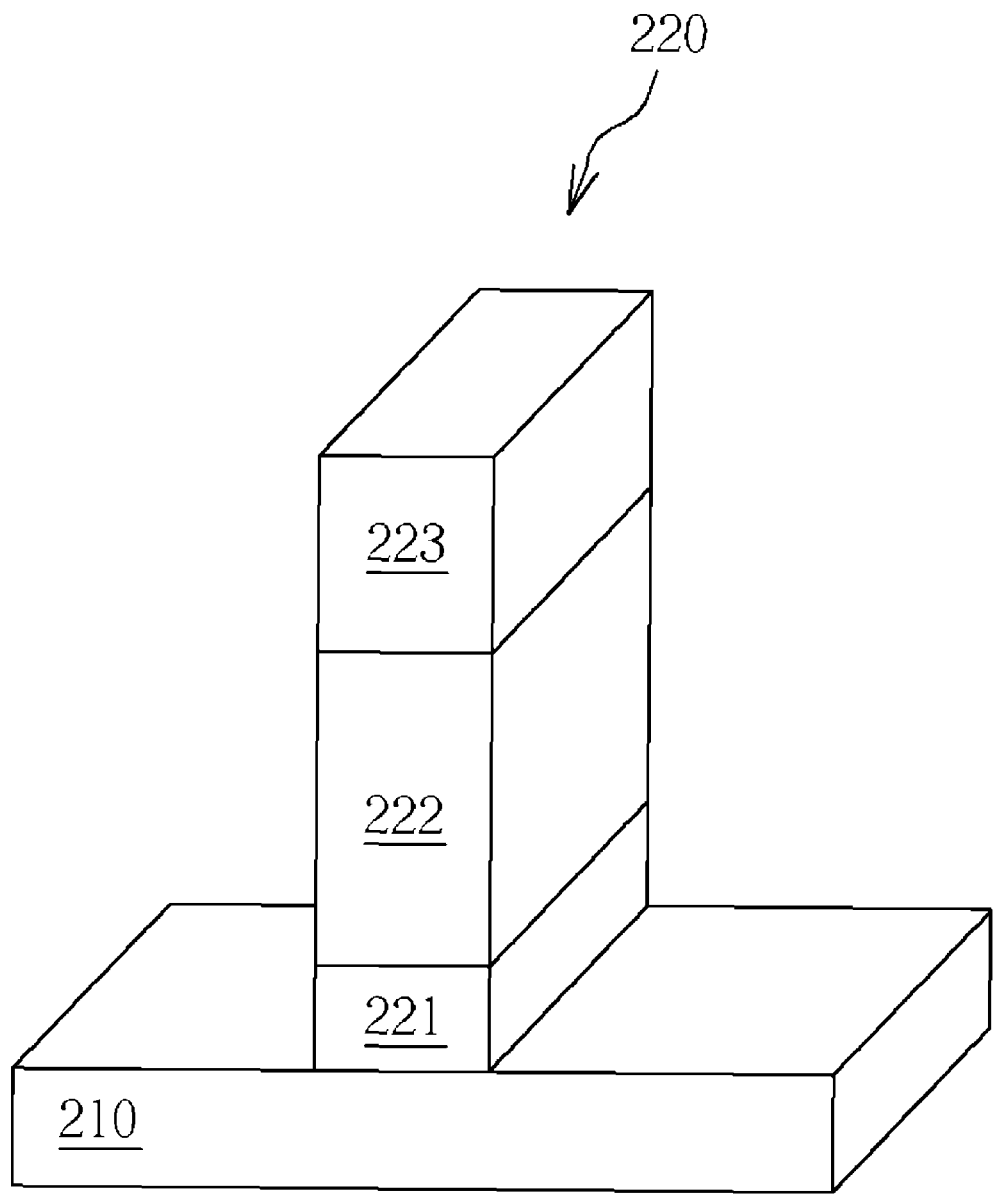

Then, the sacrificial layer 231 and the sacrificial sidewall layer 235 are removed to expose the substrate 210. Each layer may be preferably removed by selective etching. For example, the nitride 232 may be removed by hot phosphoric acid. Second, the polysilicon 233 may be removed by dilute HF and the oxide 234 and the oxide 236 may be simultaneously removed. Last, the nitride 237 may be removed by hot phosphoric acid again. Now, only the control gate region 220 is left, as shown in FIG. 3.

Figure 4:
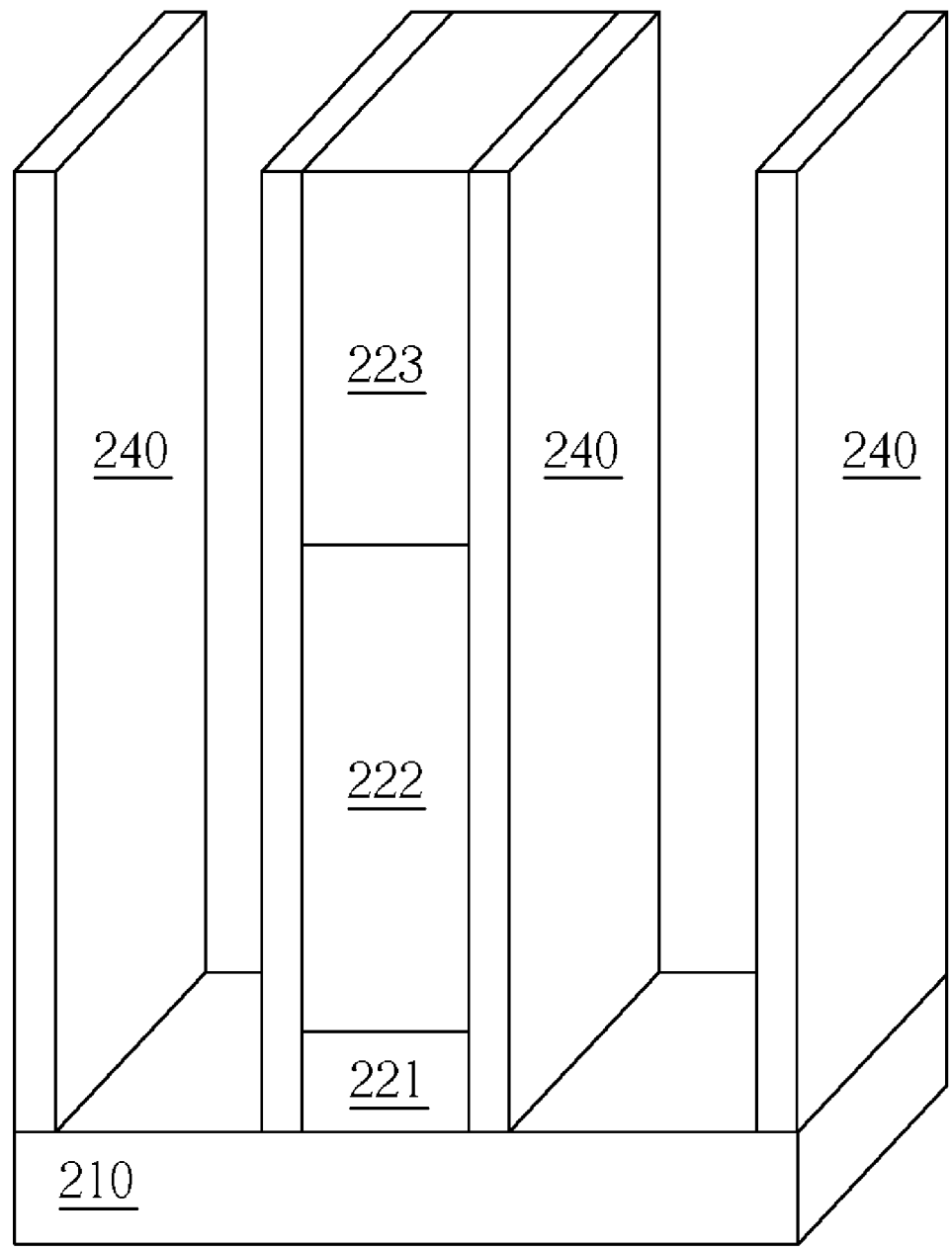

With reference to FIG. 4, a pair of dielectric sidewalls 240 adjacent to the control gate region 220 is formed. The dielectric sidewalls 240 may be a composite structure, an oxide-nitride-oxide (ONO) structure for example. The method for forming the dielectric sidewalls 240 may be that a dielectric sidewall layer is conformally deposited on the control gate region 220 and on the substrate 210, then the horizontal part of the dielectric sidewall layer is selectively removed to form the dielectric sidewalls 240.

Figure 5:
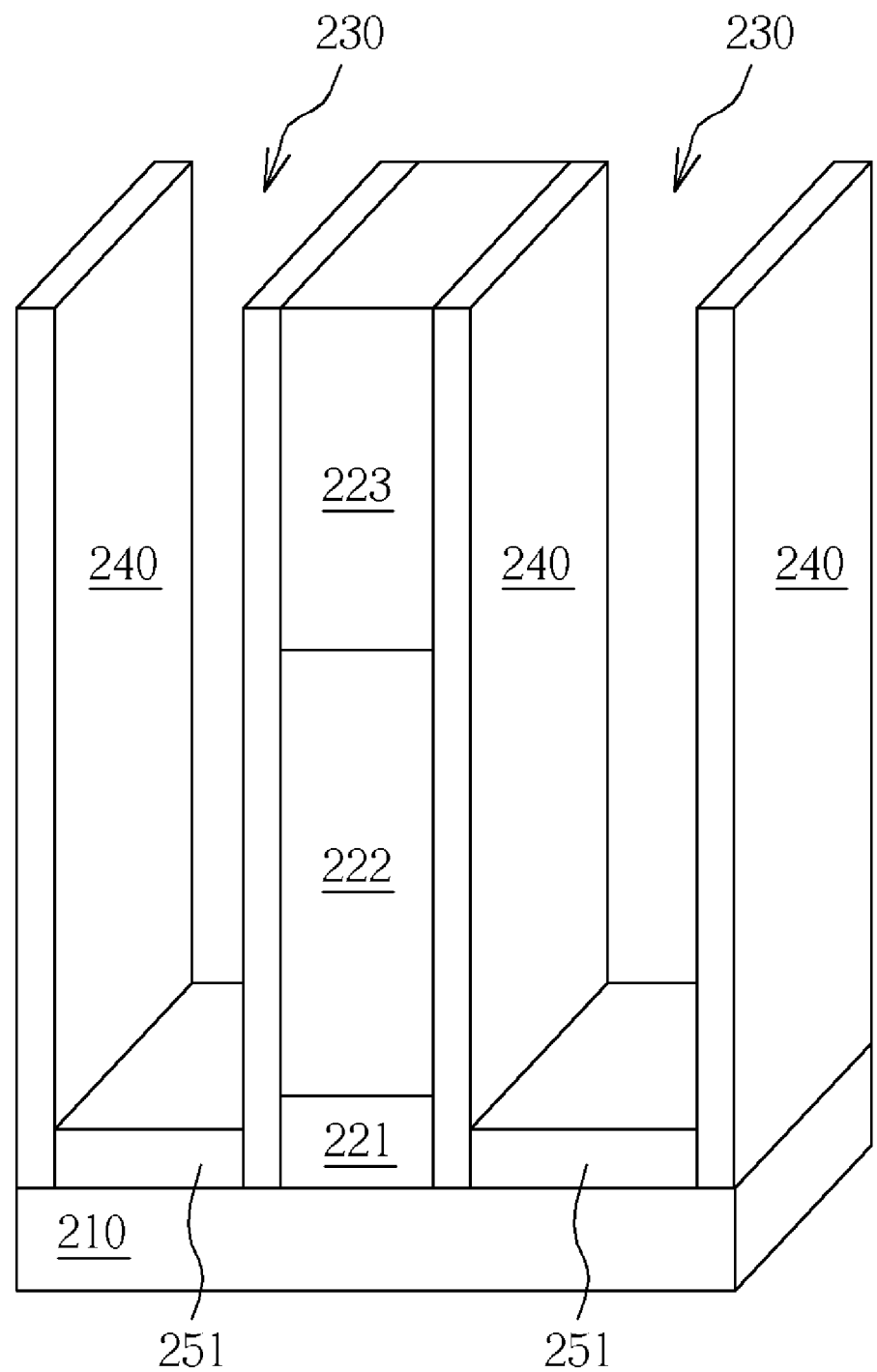

With reference to FIG. 5, a floating gate dielectric layer 251 is formed on the exposed substrate 210. For example, the floating gate dielectric layer 251 may be formed by thermal oxidation so that it may have a uniform thickness of about 70 Å-80 Å. Because the control gate oxide layer 221 has formed, plus the obstruction of the dielectric sidewalls 240, the formation of the floating gate dielectric layer 251 is undisturbed and the floating gate dielectric layer 251 may have ideal and uniform thickness.

Figure 6:
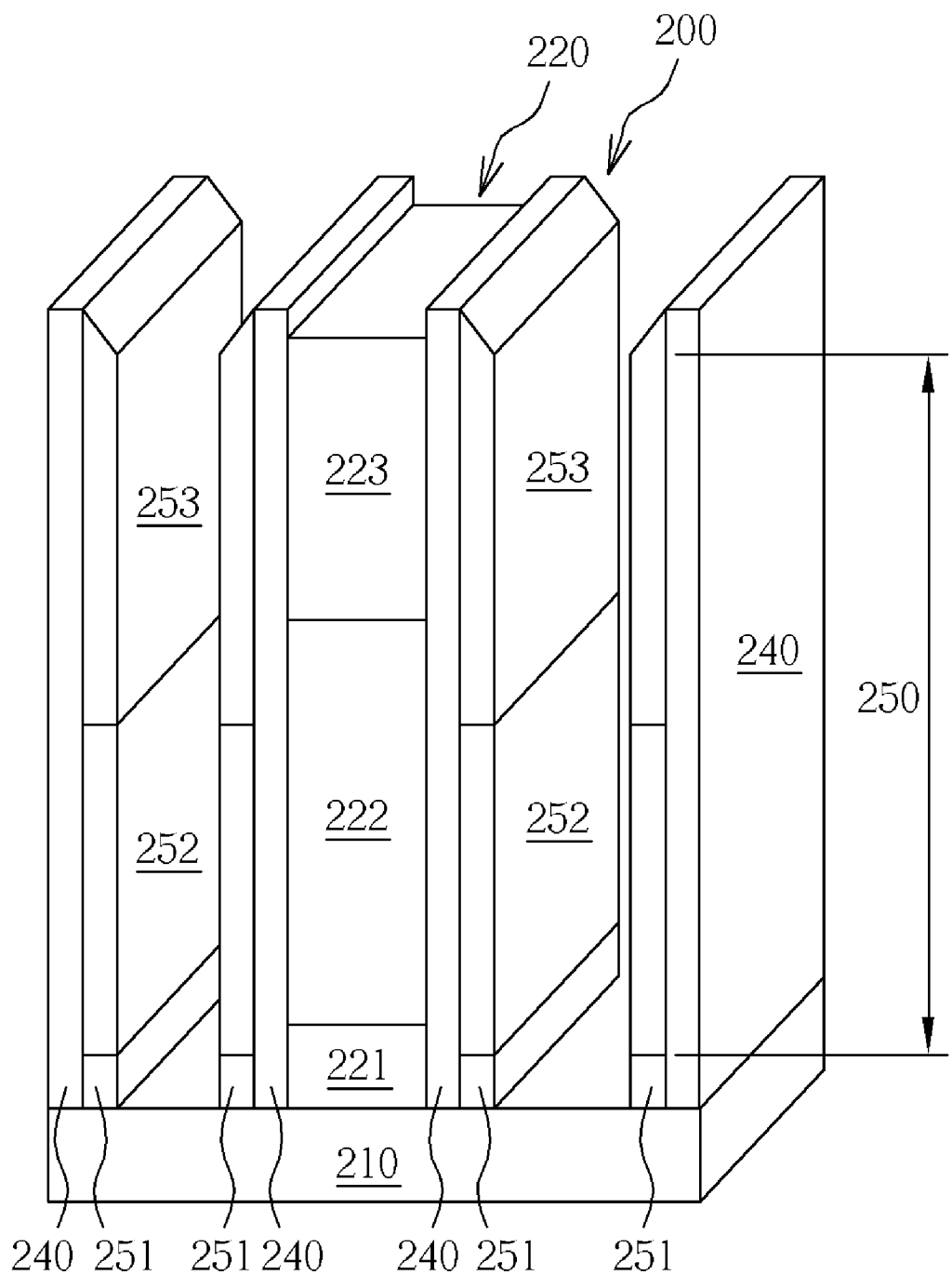

With reference to FIG. 6, a floating gate layer 250 adjacent to the dielectric sidewalls 240 and on the floating gate dielectric layer 251 is formed. The floating gate layer 250 may be a composite structure, such as a floating gate dielectric layer 251-floating gate 252-spacer 253 composite structure. Now the memory 200 of the present invention is completed. For example, the floating gate layer 250 may be formed by using a floating gate material such as polysilicon to fill the floating gate region 230. Later, part of the floating gate material may be back-etched to form a trench and to expose part of the dielectric sidewalls 240. A spacer layer, such as nitride is conformally deposited. Afterwards, the horizontal part of the spacer layer, the floating gate material and the floating gate dielectric layer 251 are separately removed by dry etching to expose the substrate 210 to complete the floating gate layer 250.

Optionally, after the floating gate layer 250 is completed, other elements such as the source, the drain or the interlayer dielectric may be formed by conventional methods, and the details will not be described here.

Figure 7:
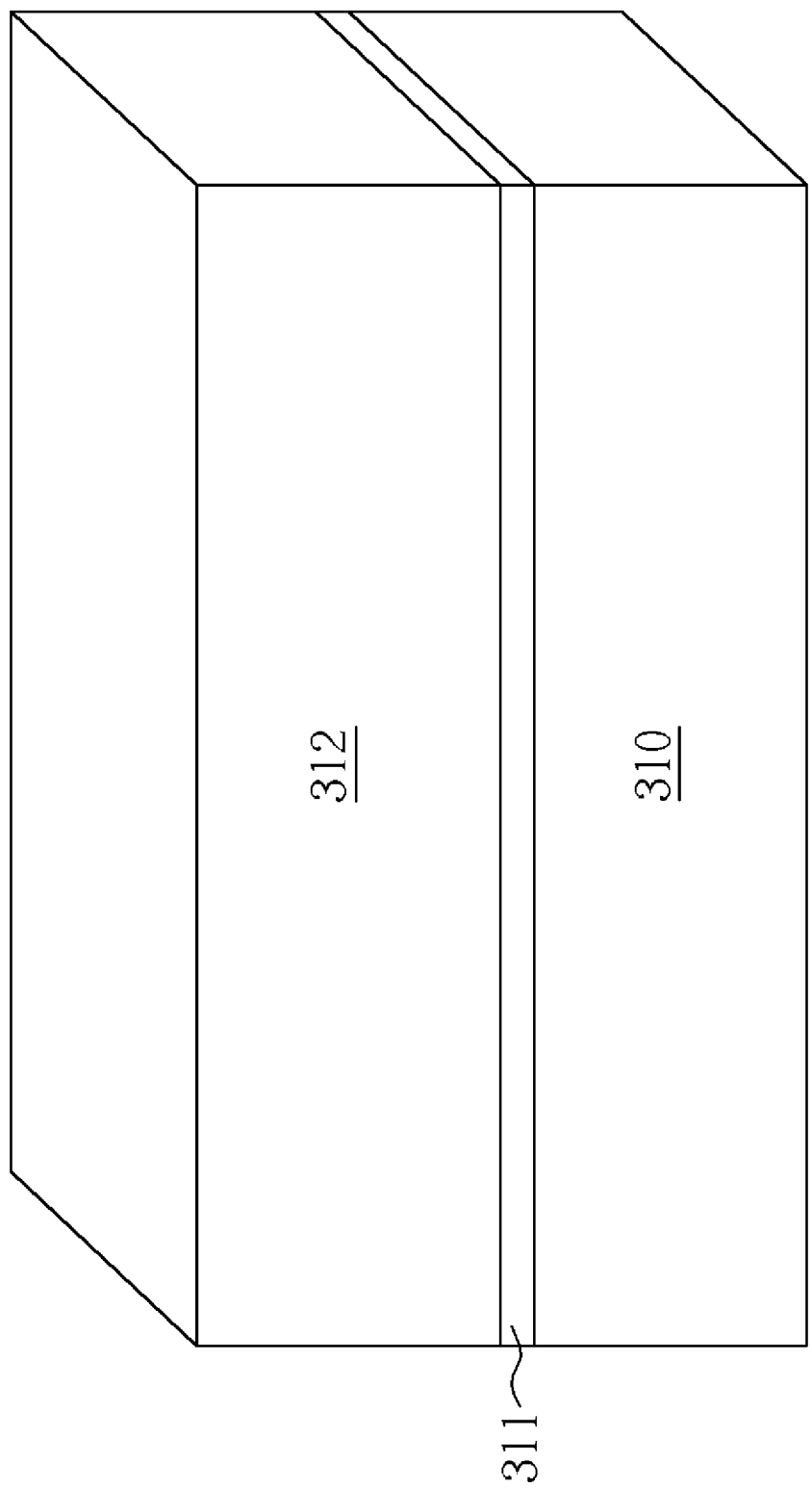
FIGS. 7-17 illustrate another preferred embodiment of the method of the present invention.

FIGS. 7-17 illustrate another preferred embodiment of the method of the present invention. First, as shown in FIG. 7, a substrate 310 is provided with a first sacrificial layer 311 and a second sacrificial layer 312 formed thereon. The substrate 310 may be a semiconductor material, such as silicon. The first sacrificial layer 311 may include an oxide and the second sacrificial layer 312 may include a nitride.

Figure 8:
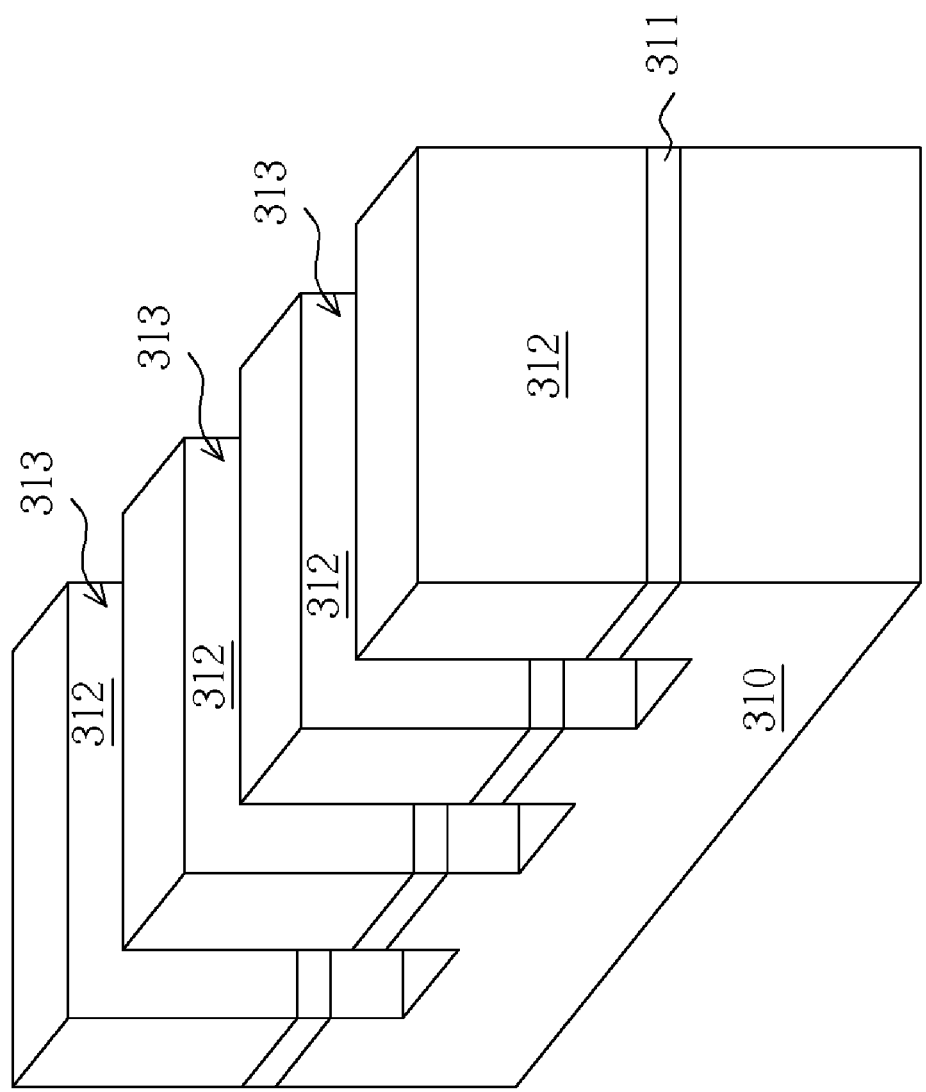

With reference to FIG. 8, the substrate 310, the first sacrificial layer 311 and the second sacrificial layer 312 are etched to form multiple parallel first trenches 313. The bottom of the trench partially exposes the substrate 310.

Figure 9:
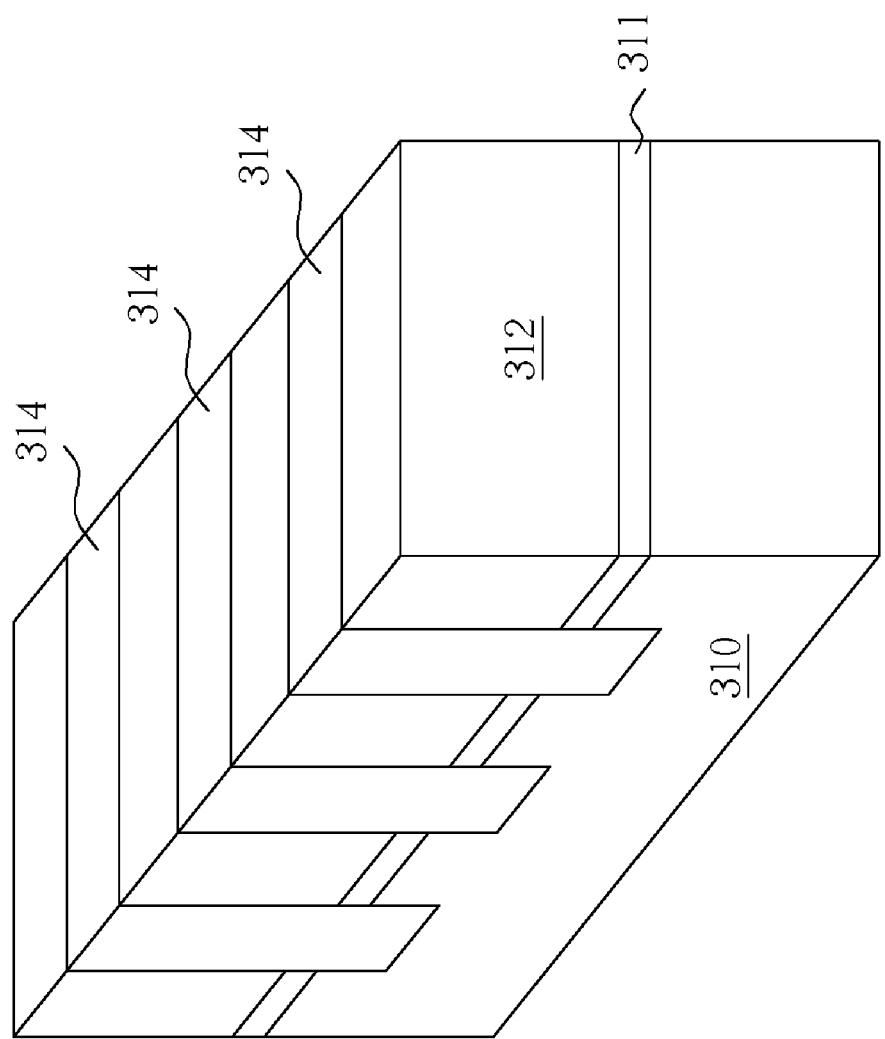
Figure 10:
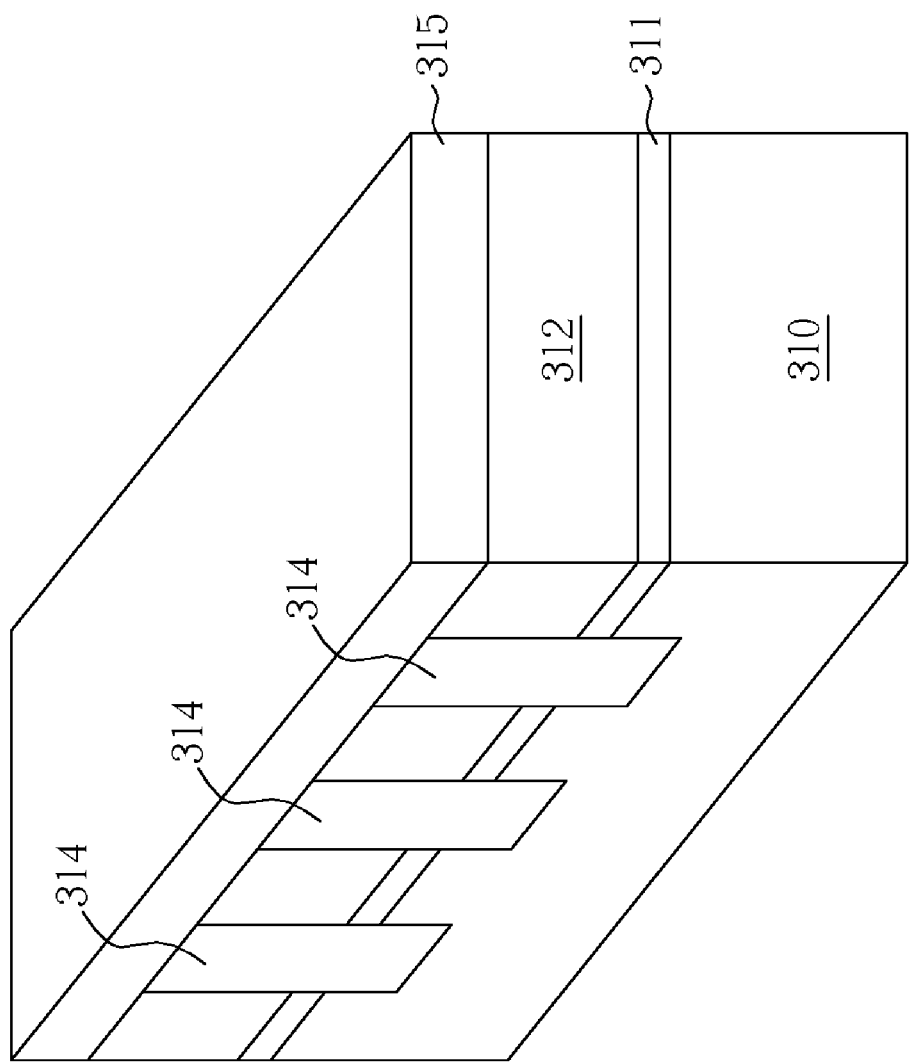

With reference to FIG. 9, the first trench 313 is filled with a first dielectric material 314 to form a shallow trench isolation. With reference to FIG. 10, a second dielectric material 315 is conformally disposed to cover the second sacrificial layer 312 and first dielectric material 314. For example, the first dielectric material may include an oxide and the second dielectric material may include a nitride.

Figure 11:
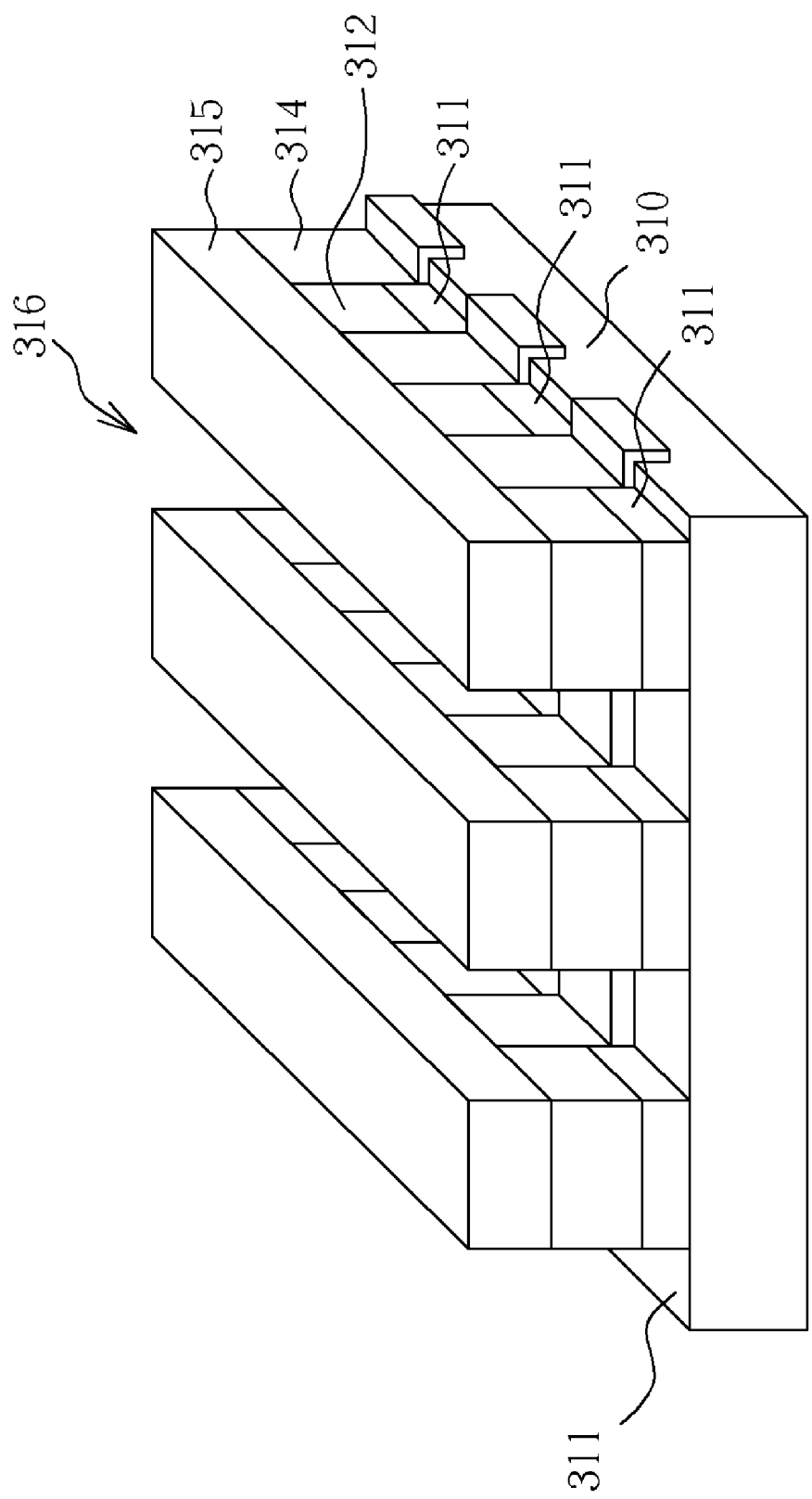

With reference to FIG. 11, the second dielectric material 315, the second sacrificial layer 312, the first sacrificial layer 311 and the shallow trench isolation 314 are removed by dry etching to form the second trenches 316 and to expose the substrate 310. For example, if the material of the layers are as mentioned, the second dielectric material 315 may be first removed by hot phosphoric acid, second the shallow trench isolation 314 may be selectively removed by HF and the second sacrificial layer 312 may be selectively removed by hot phosphoric acid, then the first sacrificial layer 311 may be removed by HF. Optionally, an etching mask such as carbon may be formed on the second dielectric material 315 to assist the dry etching to form the second trenches 316. In addition, the first trenches 313 are preferably normal to the second trenches 316.

Figure 12:
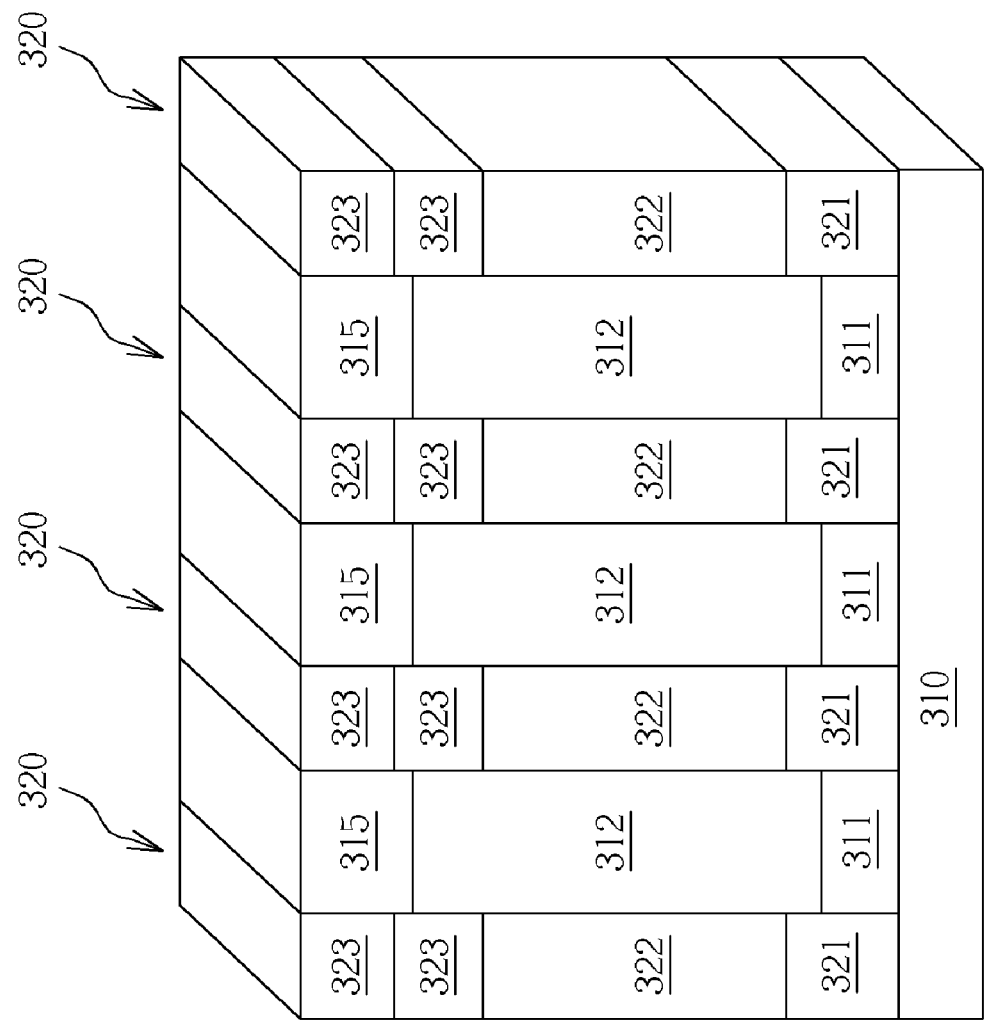

With reference to FIG. 12, a control gate region 320 is formed in the second trenches 316. The control gate region 320 includes a control gate dielectric layer 321, a control gate 322 and a hard mask 323 on the substrate 310. For example, the control gate dielectric layer 321 may include an oxide, the control gate 322 may include polysilicon and the hard mask 323 may be a composite structure.

Figure 13:
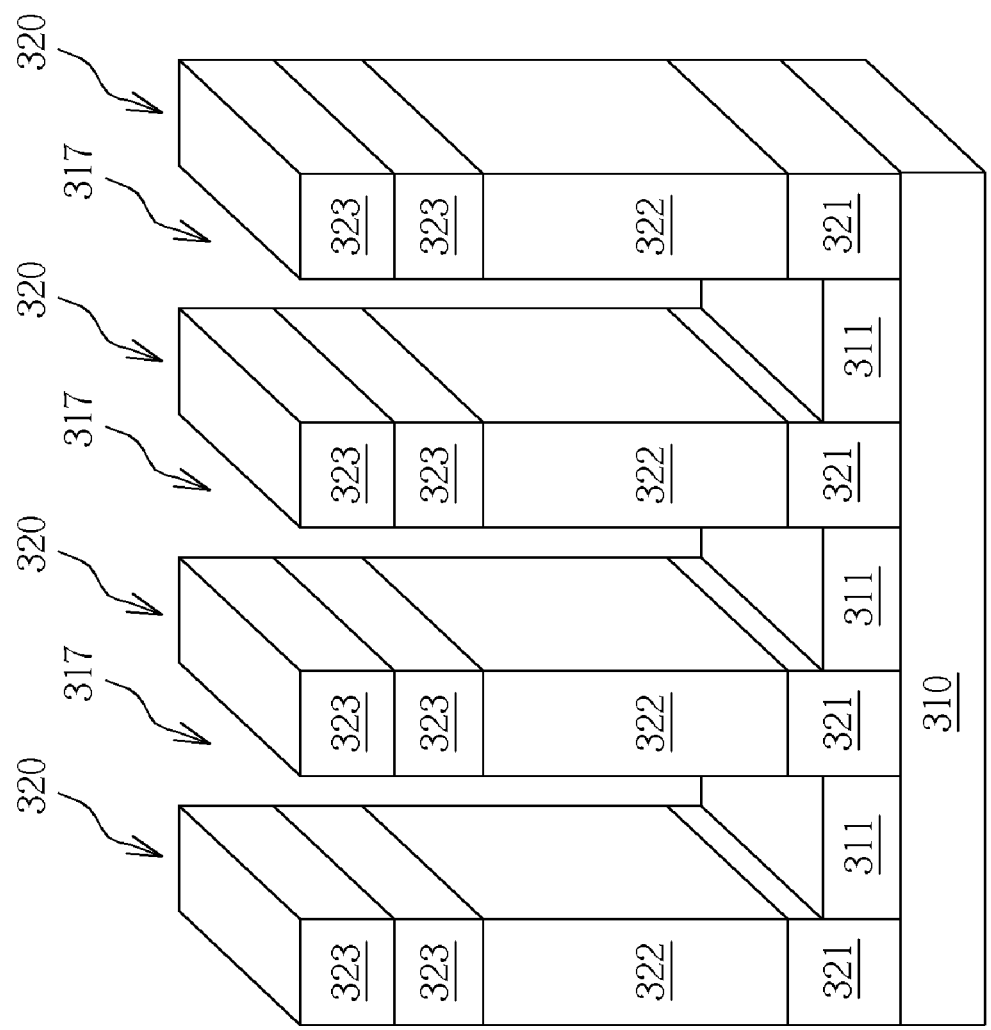

With reference to FIG. 13, the second dielectric material 315 and the second sacrificial layer 312 are removed to form third trenches 317 as the floating gate region 350 and to expose the first sacrificial layer 311. If the second dielectric material 315 and the second sacrificial layer 312 are nitride, they can be removed by wet etching such as hot phosphoric acid.

Figure 14:
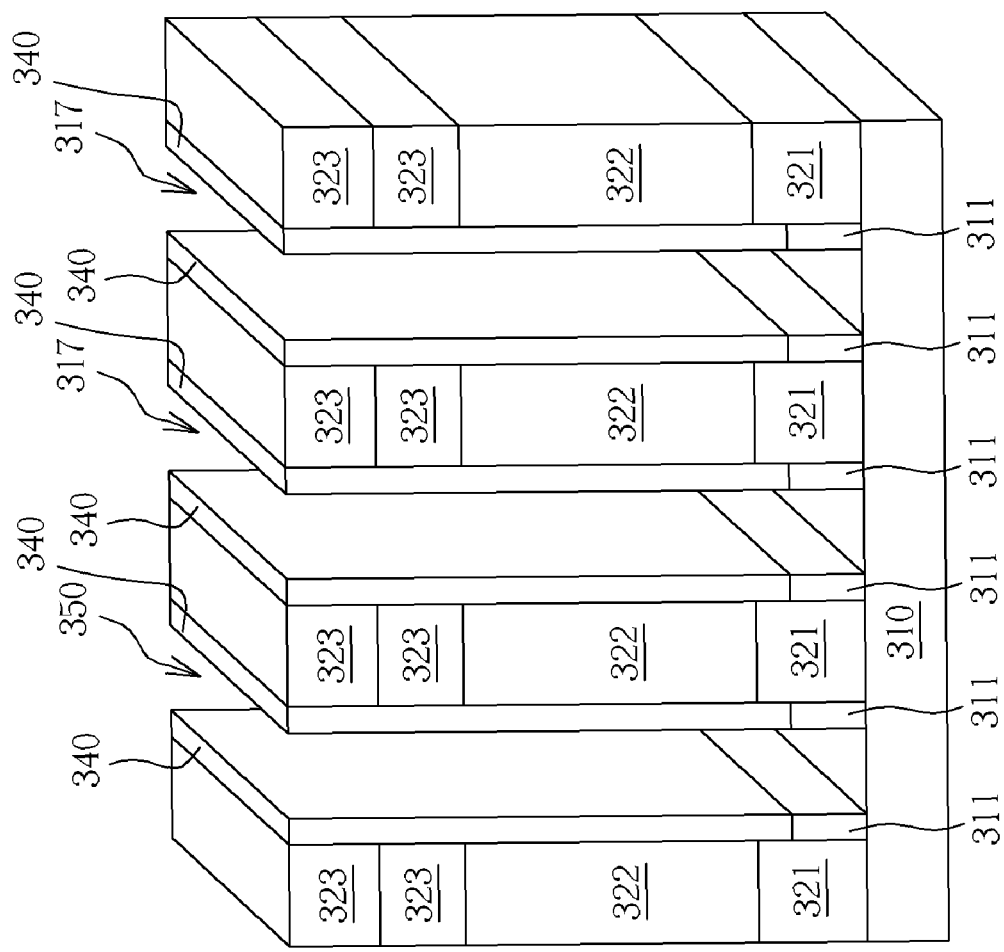

With reference to FIG. 14, a pair of dielectric sidewalls 340 adjacent to the control gate region 320 is formed in third trenches 317. The dielectric sidewalls 340 may be a composite structure, such as an oxide-nitride-oxide (ONO) structure. The method for forming the dielectric sidewalls 340 may first conformally deposit a dielectric sidewall layer on the control gate region 320 and on the substrate 310, then selectively remove the horizontal part of the dielectric sidewall 340 and the underlying first sacrificial layer 311 to form the dielectric sidewall 340 and the substrate 310 is exposed.

Figure 15:
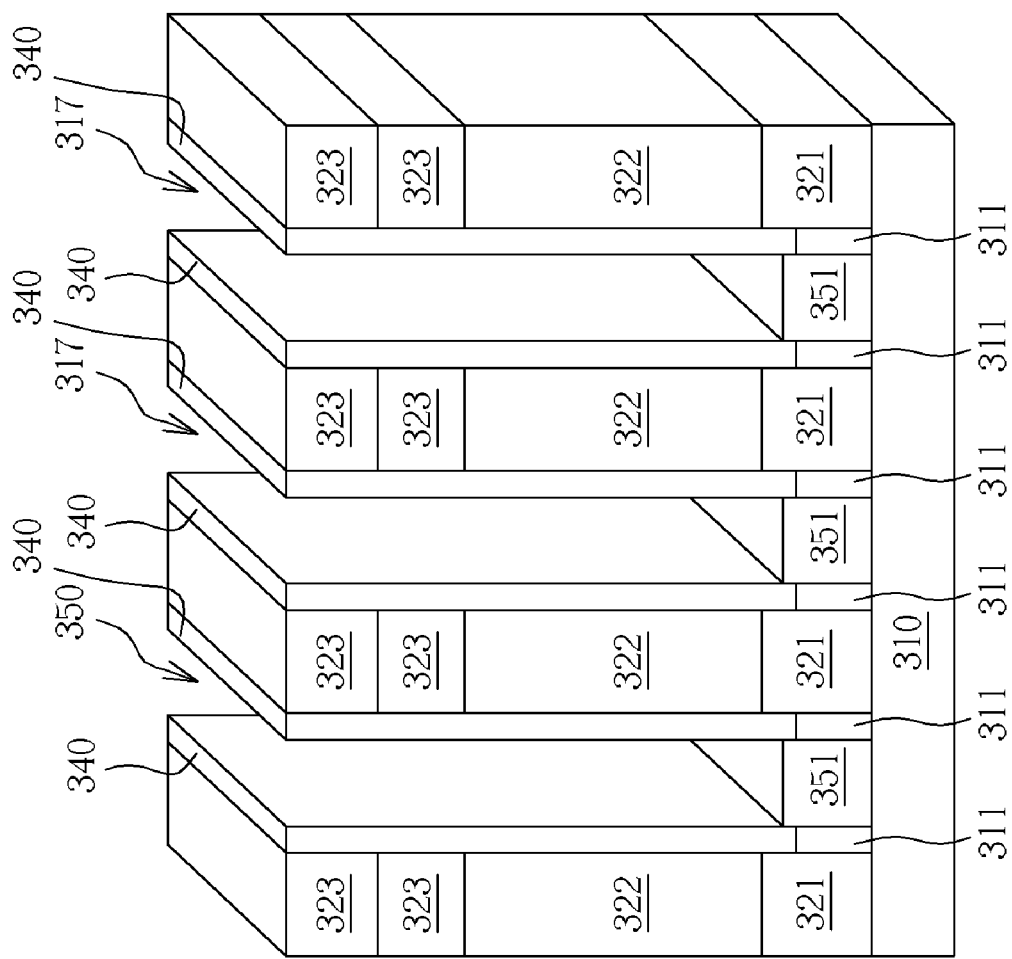

With reference to FIG. 15, the floating gate dielectric layer 351 is formed on the exposed substrate 310. For example, the floating gate dielectric layer 351 may be formed by thermal oxidation so that it may have a uniform thickness of about 70 Å-80 Å. Because the control gate oxide layer 321 has formed, plus the obstruction of the dielectric sidewalls 340 and the first sacrificial layer 311, the formation of the floating gate dielectric layer 351 is undisturbed and the floating gate dielectric layer 351 may have ideal and uniform thickness.

Figure 16:
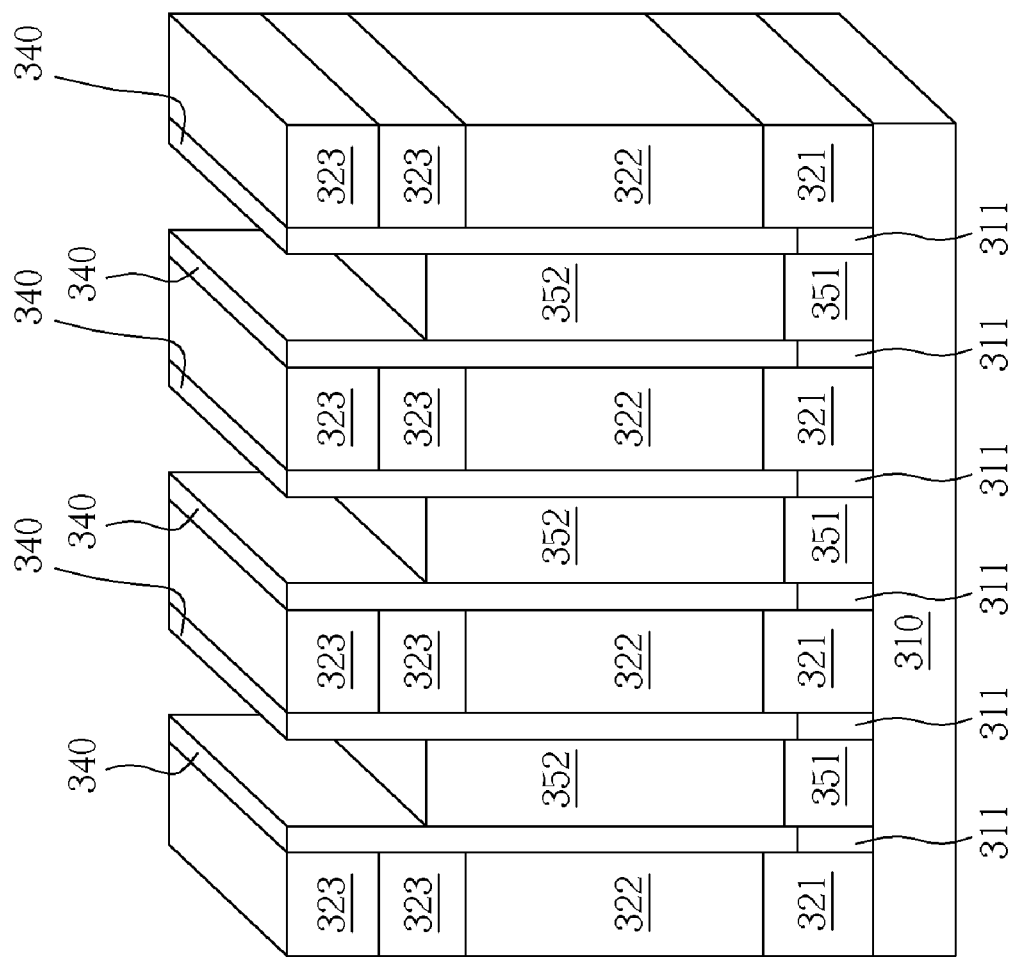
Figure 17:
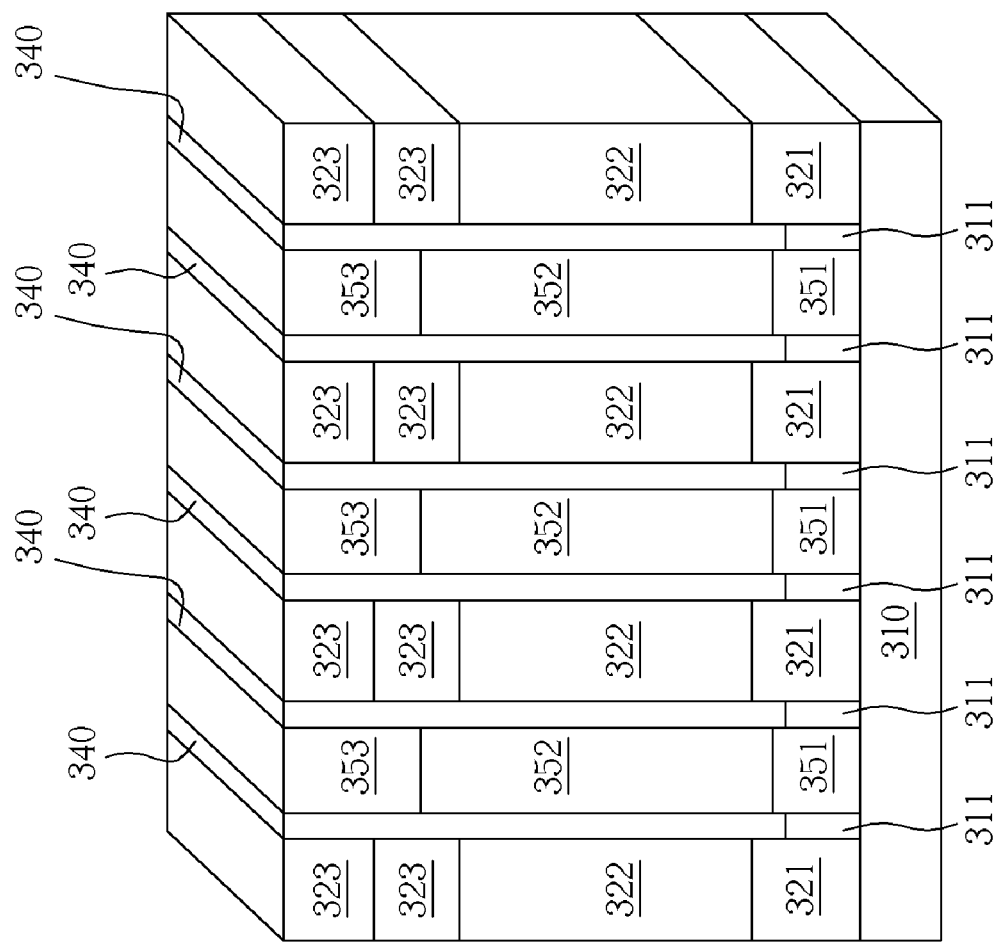

With reference to FIG. 16, a floating gate layer 352 adjacent to the dielectric sidewalls 340 is formed on the floating gate dielectric layer 351. Optionally, the floating gate layer 352 may further include a spacer layer 353 to form a composite structure, such as a floating gate dielectric layer 351-floating gate 352-spacer 353 composite structure. Now the memory 300 of the present invention is completed, as shown in FIG. 17.

The method for forming the floating gate 352 and spacer 353 may be, for example, filling the floating gate region 350 by a floating gate material such as polysilicon. Later, part of the floating gate material may be back-etched to form a trench and to expose part of the dielectric sidewalls 340. A spacer layer, such as a nitride is then conformally deposited. Afterwards, the horizontal part of the spacer layer, the floating gate material and the floating gate dielectric layer 351 are separately removed by dry etching to expose the substrate 310 to complete the floating gate layer 350.

Optionally, after the floating gate layer 350 is completed, other elements such as the source, the drain or the interlayer dielectric ... etc. may be formed by conventional methods, and the details will not be described here.

Those skilled in the art will readily observe that numerous modifications and alterations of the device and method may be made while retaining the teachings of the invention.

What is claimed is:

1. A method for manufacturing a memory comprising:
providing a substrate having a control gate region, a floating gate region adjacent to said control gate region, and a sacrificial sidewall sandwiched between said control gate region and said floating gate region, wherein said floating gate region has a sacrificial layer formed on said substrate;
removing said sacrificial layer and said sacrificial sidewall;
forming a dielectric sidewall on a side of said control gate region; and
forming a floating gate assembly in said floating gate region.

2. The method for manufacturing a memory of claim 1, wherein said control gate region comprises a control gate dielectric, a control gate and a hard mask sequentially formed on the substrate.

3. The method for manufacturing a memory of claim 2, wherein said hard mask comprises a composite structure.

4. The method for manufacturing a memory of claim 2, wherein said floating gate assembly comprises a floating gate dielectric layer, a floating gate and a spacer sequentially formed on said substrate.

5. The method for manufacturing a memory of claim 4, wherein said floating gate assembly forming step comprises:
filling said floating gate region with a floating gate material;
selectively removing part of said floating gate material to form a trench exposing part of said dielectric sidewall;
conformally depositing a spacer layer; and
selectively removing said spacer layer and said floating gate material to form said floating gate assembly.

6. The method for manufacturing a memory of claim 4, wherein said dielectric sidewall forming step comprises:
conformally depositing a dielectric layer on said control gate region and on said substrate; said
selectively removing said dielectric layer to form said dielectric sidewall.

7. The method for manufacturing a memory of claim 6, wherein said dielectric sidewall comprises an oxide-nitride-oxide composite structure.

* * * * *